United States Patent [19]

Moraveji

[11] Patent Number: 5,798,747
[45] Date of Patent: Aug. 25, 1998

[54] METHODS AND APPARATUSES FOR HIGH-SPEED VIDEO SAMPLE AND HOLD AMPLIFICATION FOR ANALOG FLAT PANEL DISPLAY

[75] Inventor: Farhood Moraveji, San Jose, Calif.

[73] Assignee: National Semiconductor Corporation, Santa Clara, Calif.

[21] Appl. No.: 560,022

[22] Filed: Nov. 17, 1995

[51] Int. Cl.$^6$ .................................................. G09G 3/36
[52] U.S. Cl. ................................................. 345/98; 345/100
[58] Field of Search ........................ 345/93, 100, 86–101; 327/94

[56] References Cited

U.S. PATENT DOCUMENTS

| | | | |
|---|---|---|---|
| 5,252,956 | 10/1993 | Senn et al. | 345/100 |
| 5,289,332 | 2/1994 | Senn et al. | 327/94 |
| 5,453,757 | 9/1995 | Date et al. | 345/89 |
| 5,481,212 | 1/1996 | Shima | 327/94 |
| 5,526,014 | 6/1996 | Shiba et al. | 345/96 |
| 5,570,105 | 10/1996 | Koyama | 345/100 |
| 5,602,561 | 2/1997 | Kawaguchi et al. | 345/100 |
| 5,623,279 | 4/1997 | Itakura et al. | 345/98 |
| 5,648,791 | 7/1997 | Date et al. | 345/89 |

OTHER PUBLICATIONS

Lewis, Stephen H. et al., "A 10–b 20–Msample/s Analog-to-Digital Converter", IEEE Journal of solid–State Circuits, vol. 27, No. 3, Mar. 1992.

*Primary Examiner*—Steven J. Saras
*Assistant Examiner*—David L. Lewis
*Attorney, Agent, or Firm*—Limbach & Limbach L.L.P.

[57] ABSTRACT

In a sample and hold amplifier of an analog video display column driver, an operational amplifier output is disconnected from a hold capacitor during the sampling and hold phases. The operational amplifier settling time is not involved in the sampling onto the hold capacitor. The operational amplifier is powered down until the scan line is written to the display. During the sampling and hold modes, no power is consumed. The analog input signal is sampled onto hold and differential capacitors with the operational amplifier disabled. Sampling speed is high since the operational amplifier is not in the loop, and therefore settling need not occur. After one scan line is sampled, a line activation command closes switches and enables the operational column drive amplifiers, thereby enabling the feedback loop of the operational amplifiers. In the preferred embodiment, switches disconnect the differential inputs of the operational amplifier from the hold capacitor and differential capacitor, respectively, when the amplifier is not enabled. In an alternate embodiment, the negative terminals of the hold and differential capacitors are directly connected to the negative and positive differential inputs of the operational amplifier, respectively. In a second alternate embodiment, there are two separate sample and hold circuits, and yet only a single column drive circuit.

26 Claims, 6 Drawing Sheets

METHODS AND APPARATUSES FOR HIGH-SPEED VIDEO SAMPLE AND HOLD AMPLIFICATION FOR ANALOG FLAT PANEL DISPLAY

BACKGROUND OF THE INVENTION

1. Field of the Invention

The present invention relates to the field of analog flat panel display sample and hold circuits, and particularly pertains to high-speed sampling and low-power analog amplification for voltage controlled pixel circuits. Specifically, the present invention involves active analog video column driver circuits which include an operational amplifier.

2. Discussion of the Related Art

In a pixel-oriented analog video flat panel, one or more analog video input signals serially representing the pixel attribute levels during each scan line are sampled onto a bank of sample and hold circuits. The bank of sample and hold circuits is configured such that there is one sample and hold circuit per column. A column is a set of pixels vertically adjacent to each other forming a vertical line on the display screen. Typically, an analog flat panel display sample and hold circuit includes a hold capacitor which is charged to the analog video input signal value at a specified time during the scan line. From the left to right across the scan line, column hold capacitors are sampled using sampling clocks which are skewed by the pixel time duration.

Conventionally, an operational amplifier, configured in a standard integrator circuit having the hold capacitor along the negative feedback path, is used to drive each pixel display column. However, the operational amplifier often consumes a large amount of power. Analog flat panel displays are often used in laptop computers which must maintain internal battery power supplies. The battery capacity is a serious constraint, and therefore it is desirable to minimize power consumption of the display driver.

Typically, the operational amplifier is configured as an integrator during the sampling and hold phases in order to compensate for any non-zero operational amplifier offset error. This imposes a minimum constraint on the sampling time because the operational amplifier must settle during the sampling time. Additionally, the operational amplifier in a conventional driver circuit consumes power during the sample and hold phases of the scan line even when the voltage values are not being written onto the scan line.

SUMMARY OF THE INVENTION

It is an object of the present invention to provide a low power display driver circuit for use in an analog flat panel display. It is another object of the present invention to provide a high-speed scan line sample and hold circuit. It is yet another object of the present invention to provide a sample and hold amplifier circuit with low output offset error. It is still a further object of the present invention to provide an sample and hold amplifier circuit which can be continuously written with new display data and yet can continuously drive a column using dual hold capacitors.

An implementation of the present invention involves a passive sample and hold circuit and an active column amplifier which acquires the standard video signal in less than 2.5 ns to within 8 bits of accuracy using a differential cancellation of charge configuration to compensate for charge injection when the amplifier is activated. An implementation of the analog video sample and hold circuit according to the present invention samples the video signal at 60 MHz with no power dissipation. The primary advantages of the present invention are a low rate of power consumption and a high sampling rate.

The analog video input signal is sampled at appropriate intervals by column sample and hold circuits and amplifiers according to the present invention. When an entire scan line has been sampled, an output enable signal is asserted which directs the held values to be driven onto the column data lines. The operational amplifier of the sample and hold circuit and column driver drives the data lines of each column and writes the voltage level stored on the hold circuit onto each respective column data line. The amplifier provides the necessary signal strength to drive the large capacitance attached to each of the column data lines.

The speed of the sampling is greatly accelerated according to the present invention, because the operational amplifier output is disconnected from the hold capacitor during the sampling phase. Thus, the operational amplifier settling time does not influence the sampling onto the hold capacitor During the sampling modes according to the present invention, no power is consumed. While energy may be put into the sample and hold circuit, it is merely being stored on the hold capacitor. The power stored in charging up the hold capacitor is supplied by the analog video input. The analog input signal is sampled onto the hold and differential capacitors while the operational amplifier is disabled, and therefore eliminates power dissipation. Furthermore, the sampling time can be shortened since the operational amplifier is not involved in the sampling.

After one line has been sampled onto the sample and hold circuits, a line activation command closes the output switches and enables the column driver operational amplifier. This action enables the feedback loop of the operational amplifier. The output of each amplifier drives the appropriate column data line either directly, or indirectly via another column driver buffer.

In the preferred embodiment of the present invention, switches disconnect the differential inputs of the operational amplifier from the hold capacitor and differential capacitor, respectively, when the amplifier is not enabled. The switches which exist according to the preferred embodiment of the present invention minimize the capacitances coupled to the negative terminals of the hold and differential capacitors, having the effect that the capacitances on the differential inputs of the operational amplifier are much smaller than the drain capacitances of each of the transistor switches.

In an alternate embodiment of the present invention, the negative terminal of the hold capacitor is directly connected to the negative differential input of the operational amplifier, and the negative terminal of the differential capacitor is directly connected to the positive differential input of the operational amplifier. According to a second alternate embodiment of the present invention, there are two separate sample and hold circuits, and yet only a single column driver circuit. In this second alternate embodiment, during even scan lines, one sample and hold circuit samples its next column value onto a first hold capacitor while the current scan line column value is being output by the amplifier from a second hold capacitor. During odd scan lines, the second sample and hold samples its next column value onto the second hold capacitor while the first hold capacitor is being output to the display through the columns.

These and other features and advantages of the present invention will be apparent from the Figures as referred to in the Detailed Description of the Invention.

BRIEF DESCRIPTION OF THE DRAWINGS

FIG. 3A illustrates a preliminary sampling sub-circuit state implemented by the sample and hold amplifier according to the present invention directly after the clock signal is asserted.

FIG. 3B illustrates the sampling sub-circuit state implemented by the sample and hold amplifier according to the present invention a slight time delay after the preliminary sampling state depicted in FIG. 3A.

FIG. 3C illustrates a preliminary hold sub-circuit state implemented by the sample and hold amplifier according to the present invention directly after the sampling state depicted in FIG. 3B.

FIG. 3D illustrates a hold sub-circuit state implemented by the sample and hold amplifier according to the present invention a slight time delay after the preliminary hold state depicted in FIG. 3C.

In the Figures, like parts are labeled with like numbers, and the hundreds digit represents one Figure in which the part can be found. For example, element 208 can be found, among other places, in FIG. 2.

DETAILED DESCRIPTION OF THE INVENTION

An implementation of the present invention involves a passive sample and hold circuit and an active column amplifier which acquires the standard video signal in less than 2.5 nanoseconds to within 8 bits of accuracy using a differential cancellation of charge configuration to compensate for charge injection when the operational amplifier is activated. An implementation of the analog video sample and hold circuit according to the present invention samples the video signal at 60 MHz with no power dissipation. The primary advantages of the present invention are low power consumption and high sampling rate.

Figure 1:
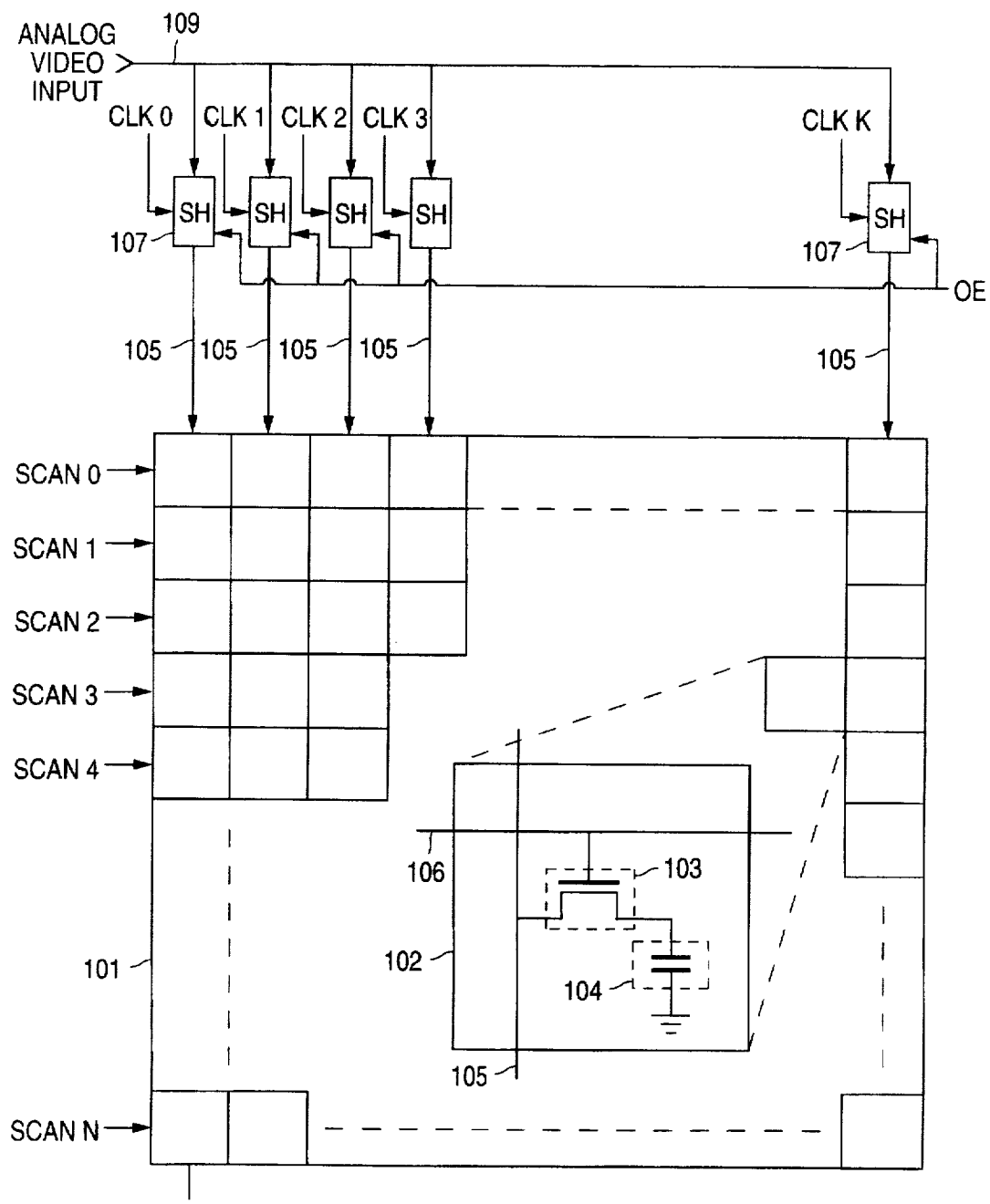
FIG. 1 illustrates a suitable analog flat panel display, analog video input signal, and sample and hold circuit bank and column drive amplifiers according to the present invention.

FIG. 1 illustrates the environment of the present invention. An analog flat panel display 101 includes N scan lines. Each scan line includes k rectangular pixels such as illustrated by element 102. Each pixel 102 includes a pixel drive transistor 103 and a pixel capacitance 104. The drain of the pixel transistor 103 is connected to the pixel capacitance 104, while the source of the pixel transistor 103 is connected to a data line 105. A scan line select signal 106 drives the gate of the pixel transistor 103. Each data line 105 connects in parallel to a column of pixels—one from each row. Each scan line select signal 106 connects to every pixel in the corresponding scan line.

An analog video input signal 109 serially represents the analog display levels for the N*k pixels of the display 101. In a typical implementation of the present invention, k might be 768 while N is 1024; each chip for video distribution includes enough circuitry to drive 80 columns, for example, of red R, green G, and blue B. In this example, the analog input video input signal 109 would be routed to each of several chips. In order to reduce the drive requirement of the analog video input signal 109, each chip contains a very high-speed tracking amplifier to drive its internal sampling circuits. However, total power consumption is very important; therefore, it is desirable to enable the tracking amplifiers only during the portions of the scan lines driven by that particular chip. A tracking amplifier select signal is daisy-chained among all the chips required to drive the specified number of columns in the display, so that when one chip has finished sampling, it enables the next chip by asserting a carry out signal. Each chip enables it successor until an entire scan line has been sampled.

The pixel information is typically transmitted through the analog video input signal 109 scan line by scan line, such that the uppermost line is transmitted first. Within each scan line, the analog video input signal serially represents the display levels for each of the pixels beginning at the left edge and continuing to the right edge. For a color display, each pixel contains a R (red), G (green), and B (blue) element, each of which is independent from the other two. Therefore, in a color system, the analog video input signal 109 would consist of three separate analog signals. Similarly, each pixel 102 would include three separate data lines 105, transistors 103, and capacitors 104. The scan line select 106 for any given line would control all of the components (R, G, and B, for example) for k pixels on the scan line. For simplicity of explanation, in the remainder of the description, the system of the present invention will be described with respect to a single analog value for each pixel, although it is clear that the methods and devices described are directly applicable to color displays in which the pixels have multiple analog values (typically R, G, and B) associated with them.

The analog video input signal 109 is sampled at appropriate intervals by column sample and hold circuits and amplifiers 107 according to the present invention. When an entire scan line has been sampled, an output enable signal OE is asserted which directs the k held values to be driven onto the k column data lines. An operational amplifier within the sample and hold circuit and driver drives the data lines of each column and writes the voltage level stored in the hold portion of the circuit onto the column data lines 105. The amplifier provides the necessary signal strength to drive the large capacitance attached to each of the column data lines 105.

Figure 2:
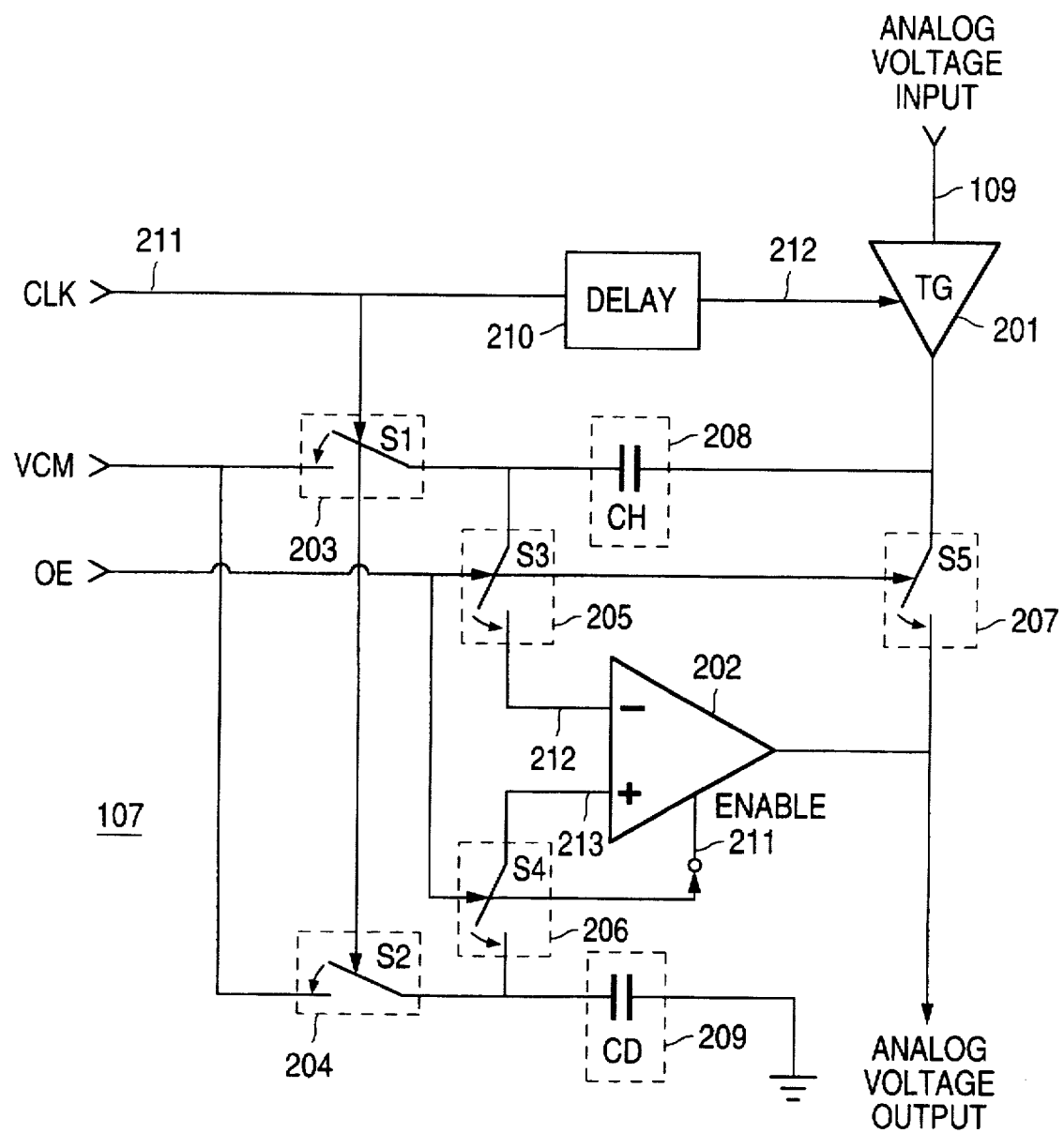
FIG. 2 illustrates a sample and hold circuit and column driver operational amplifier according to the present invention.

FIG. 2 illustrates a sample and hold circuit 107 according to the present invention. The amplifier which drives the column data lines 105 either is the operational amplifier 202 itself, or alternatively is an intermediate buffer (not shown) which drives the potentially large capacitance of the pixel columns 105. In the block diagram 107 of the sample and hold, the analog input video signal 109 is sampled through the enabled transmission gate TG 201 onto the positive plate of hold capacitor CH 208. The hold capacitor CH 208 is on the order of 100 fF in the preferred embodiment of the present invention implemented using in VLSI with modern feature sizes. In normal sampling operations, during the pixel time slot of the scan line corresponding to the column, switches S1 203 and S2 204 are closed. FIG. 3A illustrates the preliminary sampling state of the circuit 107 shown in FIG. 2 after switches S1 and S2 are closed while switches S3 205, S4 206, and S5 207 are open. Switches S1 and S2 are closed by the asserting of the clock (CLK 211) signal shown in FIG. 2. As illustrated in FIG. 3A, during the preliminary sampling phase, the negative plates of both hold capacitor CH 208 and differential capacitor CD 209 are charged to VCM (voltage common mode).

After a slight delay provided by the delay gate 210, the transmission gate 201 is turned on by the rising edge of its enable signal 212. FIG. 3B illustrates the sampling state of the circuit shown in FIG. 2 when the transmission gate 201 is conducting while switches S1 203 and S2 204 are closed. As illustrated by FIG. 3B, once the transmission gate 201 is enabled to conduct, the analog video signal 109 is sampled very quickly onto capacitor CH 208.

The speed of the sampling is greatly accelerated according to the present invention, because the operational amplifier 202 output is disconnected from the hold capacitor CH 208. Thus, the operational amplifier settling time (as illustrated by ts0, ts1, and ts2 in FIG. 6) is not involved in the sampling onto the hold capacitor CH 208. However, powering down the amplifier during the sampling phase has the result that operational amplifier offsets will not be compensated. Most operational amplifiers have a non-zero output offset voltage Voffset which is the output voltage level when the two differential inputs Vin− and Vin+ of the operational amplifier are shorted together. If negative feedback is introduced into the operational amplifier 202 circuit by closing switches S5 and S3 during the sampling phase, then any non-zero operational amplifier offset will be at least partially compensated for at the expense of a longer sampling settling time and greater power dissipation. The approach taken according to the present invention tolerates the operational amplifier offset error while reducing the sampling time and power dissipation during sampling. Additionally, since the operational amplifier is disabled during sampling according to the present invention, the two inputs of the operational amplifier which are disconnected from the capacitors CH 208 and CD 209 by switches S3 205 and S4 206, respectively, may float to different voltages when the loop is closed during the hold mode. Differential charge redistribution will affect the accuracy in the same manner as operational amplifier offset error.

As illustrated by the lack of active or dissipative elements in FIGS. 3A and 3B, during the sampling modes, no power is consumed. While energy may be put into the sample and hold circuit, it is merely being stored on the hold capacitor CH 208. The power stored in charging up the hold capacitor CH 208 is supplied by the analog video input 109. The analog input signal is sampled onto capacitors CH 208 and CD 209 with the operational amplifier 202 disabled, and therefore eliminates some power dissipation. Furthermore, the sampling speed can be increased because the operational amplifier 202 output is not part of the active subcircuit during the sampling phase.

FIGS. 3C and 3D illustrate the state of the circuit 107 shown in FIG. 2 during the hold mode, which begins at the falling edge of the CLK input signal 211. During the preliminary hold mode, first switches S1 203 and S2 204 are opened, as illustrated by the sub-circuit shown in FIG. 3C. After a slight delay provided by the delay circuit 210, the falling edge of the transmission gate enable signal 212 occurs, and transmission gate TG 201 is disabled. FIG. 3D illustrates the hold mode, in which the voltage Vsh sampled and held on the hold capacitor CH 208 is stored until all columns have been sampled for an entire scan line. If each scan line has k pixels, then one line is sampled by storing k values onto k hold capacitors. Each of the k circuits 107 such as shown in FIG. 2 is identical except that the sampling clock input 211 is delayed by the pixel-time duration. The production of the clocks shown in FIG. 1 (CLK0 through CLKk) can be performed by one of many methods as is known by those skilled in the art. For example, k+b (where b represents the blanking time and any other per scan line overhead) controllable delay elements can be configured into a delay-locked loop driven by the scan line clock. In any case, by some means the clock is skewed and the next slice of video is sampled into and sample and hold and this action is repeated for entire video line.

Figure 3E:
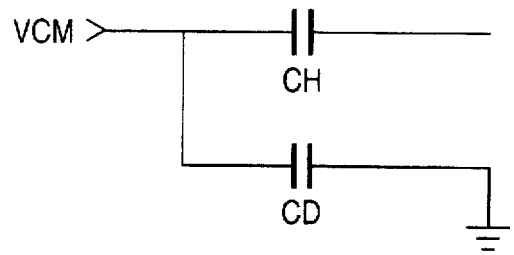
FIG. 3E illustrates a column drive sub-circuit state implemented by the sample and hold amplifier according to the present invention after the hold state depicted in FIG. 3D.
Figure 3E:
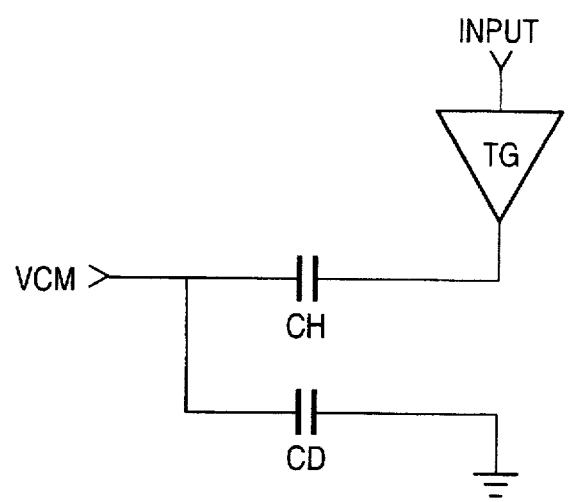
Figure 3E:
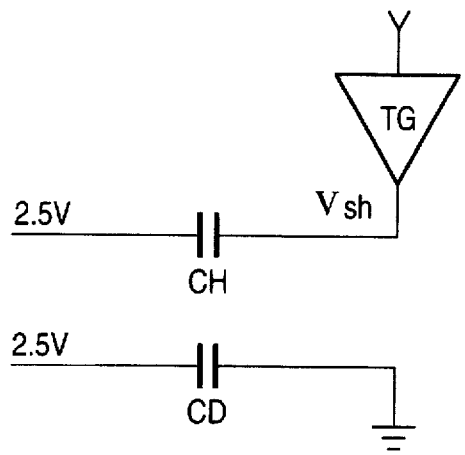
Figure 3E:
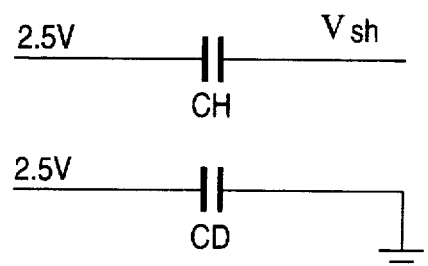
Figure 3E:
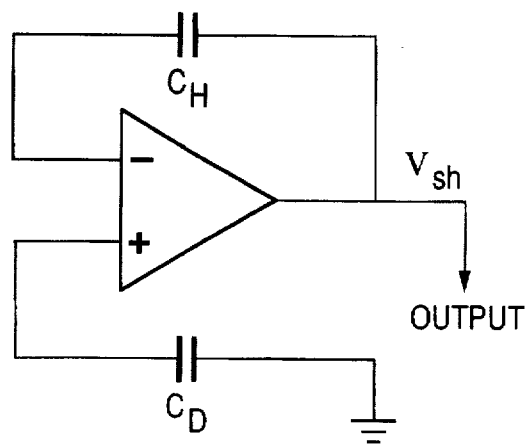

After one line is sampled on all the sample and hold circuits, a line activation command closes switches S3 205, S4 206, and S5 207 and enables the operational column drive amplifier 202. The column drive state of the circuit 107 shown in FIG. 2 is illustrated in FIG. 3E. This action enables the feedback loop of the operational amplifier 202. The output of each amplifier 202 drives the appropriate column data line either directly, as shown in FIG. 1, or indirectly via another column driver buffer (not shown).

Figure 4:
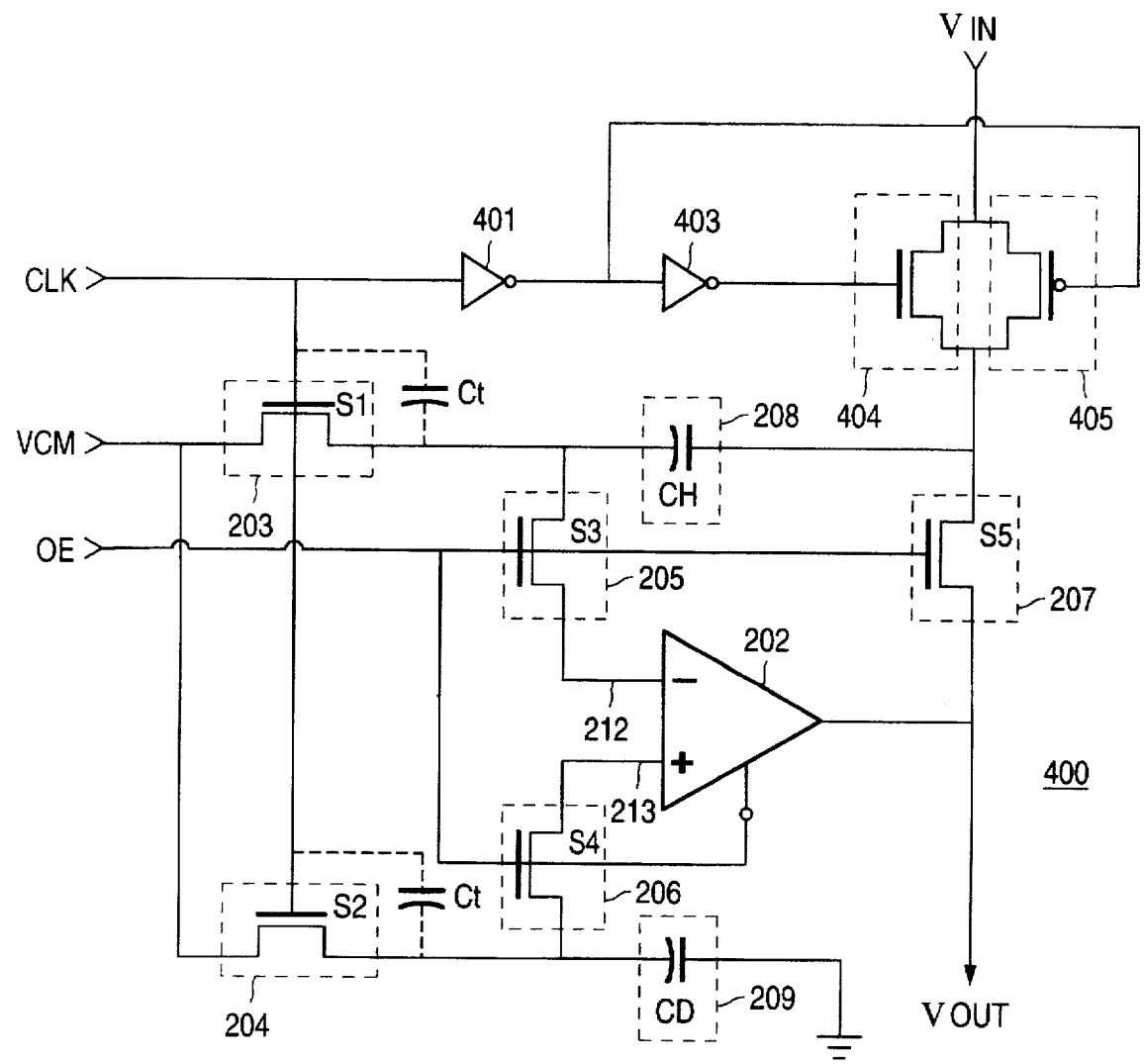
FIG. 4 illustrates a MOS implementation of the sample and hold amplifier according to the preferred embodiment of the present invention.

FIG. 4 illustrates a CMOS implementation of the circuit shown in FIG. 2. All switches S1 203, S2 204, S3 205, S4 206, and S5 207 are implemented with simple N type MOS pass transistors. One of the advantages utilized by the present invention is differential cancellation of charge injection. Charge injection occurs as a result of capacitive effects of the switches S1 through S4. The gate of any MOS transistor (such as 203, 204, 205, or 206) has a non-zero capacitance. This capacitance is at least partially coupled to the source and drain of the transistor. The capacitance between the gate and the source is referred to as a parasitic capacitor Ct. Referring to FIG. 4, when the CLK signal is asserted from zero volts to the positive logic value voltage to turn on the n-channel transistors S1 and S2, the upper plate of the parasitic capacitors Ct (shown in dotted lines in FIG. 4) is changed in voltage by delta v. This draws carriers to the negative plate (the drain), thereby injecting charge. Thus, a non-zero charge is injected into the drain of S1 and S2 through the parasitic gate to drain capacitors Ct. The change in voltage for the hold capacitor CH 208 is delta v * Ct/Ch, where Ct represents the parasitic gate/drain capacitance, and where Ch represents the capacitance of the hold capacitor CH 208. Thus, the voltage on the hold capacitor is affected by charge injection caused by switch S1. However, the differential capacitor CD 209 is designed to be equal in capacitance to the hold capacitor CH, and the switch S2 204 is designed to be identical to switch S1 203; therefore, any charge injected into the hold capacitor CH 208 will be canceled by an identical charge being injected into differential capacitor CD 209.

As illustrated in FIG. 4, the delay circuit 210 shown in FIG. 2 is illustrated as two invertor delays 401 and 403 in FIG. 4. The transmission gate 201 is implemented as an n-channel device 404 in parallel with a p-channel device 405. The existence of the delay is important, so as to provide consistent injected charge distribution.

Switches S3 205 and S4 206 are not essential to the present invention. Thus, in an alternate embodiment of the present invention, the negative terminal of the hold capacitor CH 208 is directly connected to the negative differential input 212 of the operational amplifier 202, and the negative terminal of the differential capacitor CD 209 is directly connected to the positive differential input 213 of the operational amplifier 202. Furthermore, removing the switches and replacing them with short circuits will ensure that the inputs of the operational amplifier 202 do not float. The elimination of floating gates is a desirable goal for MOS designs.

However, in the preferred embodiment of the present invention, switches S3 205 and S4 206 disconnect the differential inputs 212 and 213 of the operational amplifier 202 from the hold capacitor CH 208 and differential capacitor CD 209, respectively, when the amplifier 202 is not enabled. This structure makes benefit of the differential charge injection cancellation on hold and differential capacitors CH 208 and CD 209, respectively. More significantly, however, the use of the switches S3 205 and S4 206 in the preferred embodiment of the present invention minimizes the capacitance coupled to the negative terminals of the hold and differential capacitors CH 208 and CD 209. When the switches S3 205 and S4 206 are turned off by the output enable signal OE being at a low voltage, the drain of S3 is coupled to the hold capacitor CH 208 while the drain of S4 is coupled to the differential capacitor CD 209. Under those conditions, however, any internal gate capacitances on differential amplifier inputs 212 and 213 is disconnected from the hold and differential capacitors. This importance of this feature is that the capacitances on a differential input 212 or 213 is typically much larger than the drain capacitance of one of the switches S3 205 or S4 206.

Figure 5:
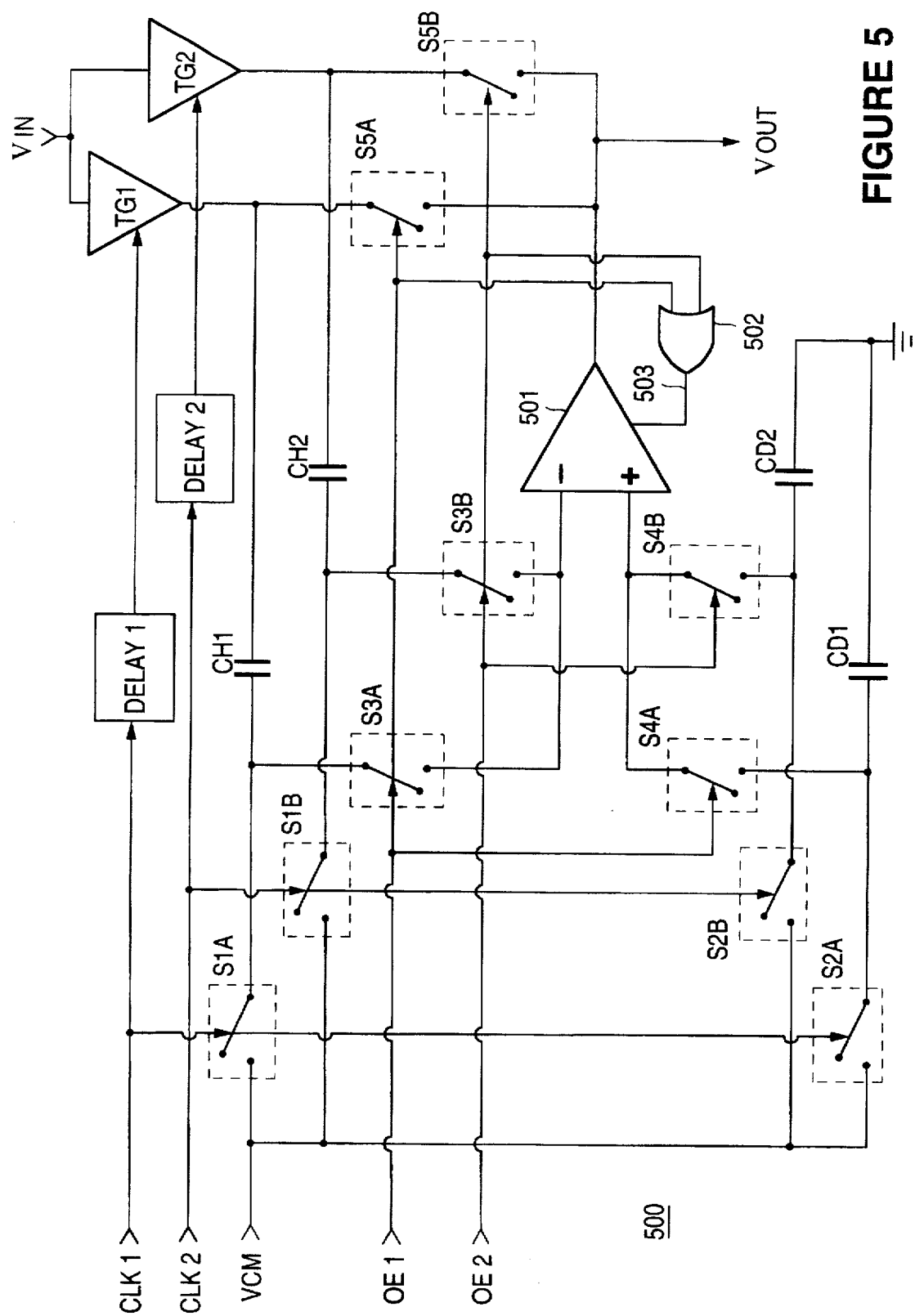
FIG. 5 illustrates an alternate embodiment of the sample and hold circuit and column drive operational amplifier according to the present invention in which dual hold capacitors allow output of the present pixel voltage stored on one hold capacitor while the next scan line pixel voltage is being latched onto the other hold capacitor.

FIG. 5 illustrates a sample and hold circuit and column drive amplifier 500 according to a second alternate embodiment of the present invention. The circuit shown in FIG. 5 duplicates all the elements of the circuit shown in FIG. 2 except that there is a single operational amplifier 501 which is connected to both sample and hold circuits. Thus, there are two separate sample and hold circuits, and yet only a single column drive circuit 501 according to this second-alternate embodiment of the present invention. The enable input 503 for the operational amplifier 501 is the logical OR 502 of the output enable OE1 for the first sample and hold circuit and the output enable OE2 for the second sample and hold circuit. A bank of sample and hold circuits and column drive amplifiers 500 exist on a per pixel column basis. Thus, if there are k columns in the display, there are k sample and hold circuits and column drive amplifiers 500 in the bank. If N is the number of scan lines in the display, for i from 1 to N, when i is odd, transmission gate TG1 samples its next column value $V_{i+1}$ onto capacitor CH1 while the present scan line column value $V_i$ is being output by the amplifier from capacitor CH2. During the other alternate scan lines (when i is even), transmission gate TG2 samples its next column value $V_{i+1}$ onto capacitor CH2. Of course, TG1 could alternatively be used for even scan lines, while TG2 is used for odd scan lines. In this way, the pixel columns can be driven more continuously because it is not necessary to stop driving each pixel column in order to sample the next pixel value for that column. This approach if useful when the pixel elements must be constantly driven to maintain their desired characteristics. The next column value for both even and odd scan lines is two scan lines down from the current scan line, such that CH1 always holds even (alternatively odd) scan line pixels, while CH2 always holds odd (alternatively even) scan line pixels. With this configuration, it is possible to continuously sample an input video signal while continuously driving the display. In other words, the amplifier 501 might be enabled continuously depending upon the timing of the system. Alternatively, the operational amplifier 501 is disabled during a significant portion of each scan line display time. Using the configuration 500 shown in FIG. 5, the driving of the display and the sampling of scan lines can be somewhat decoupled.

Figure 6:
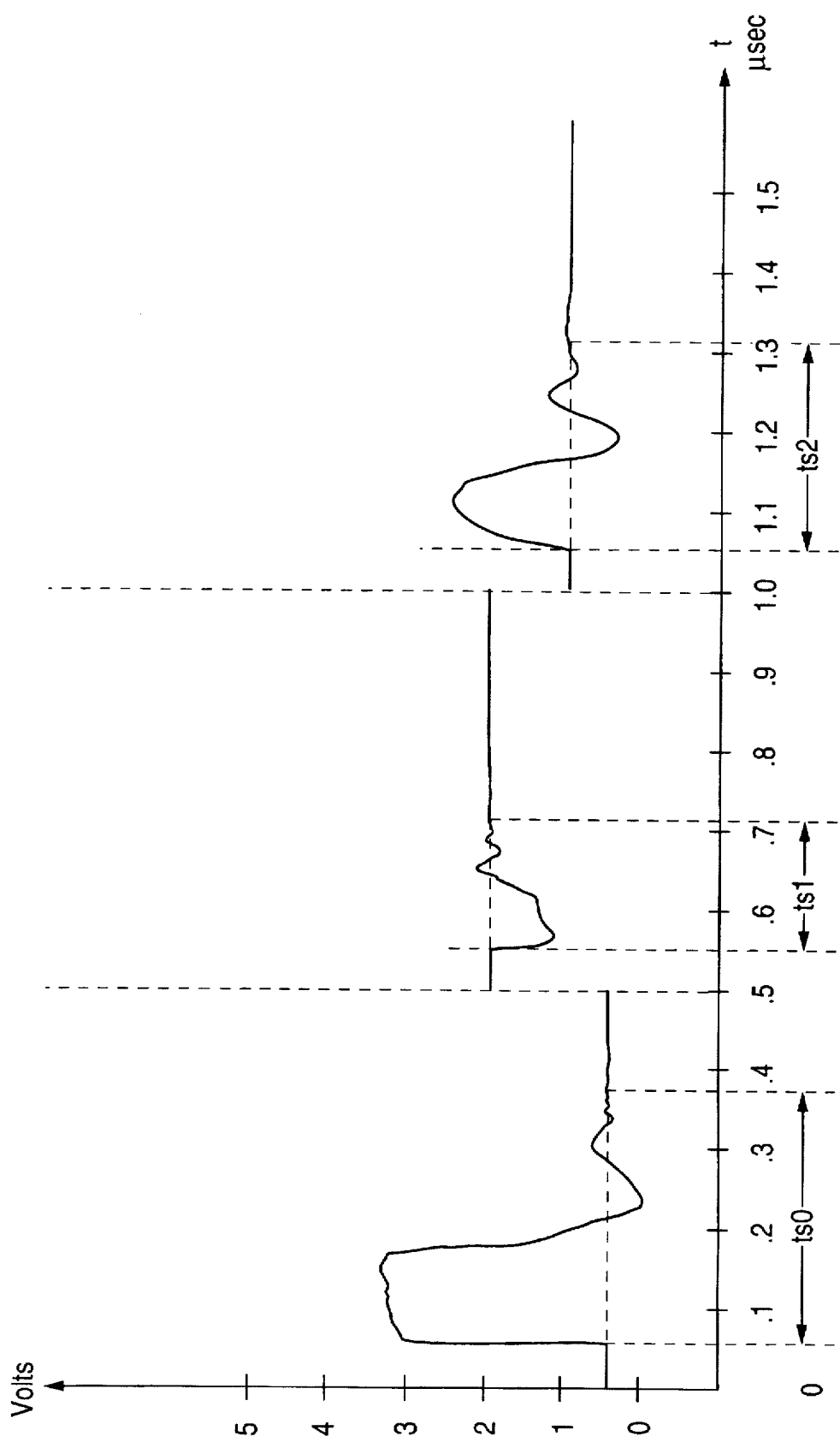
FIG. 6 is a timing diagram showing the pixel column input and output of a sample and hold amplifier according to the present invention during three test operations.

FIG. 6 is a timing diagram of a test simulation of the input and output of the sample and hold circuit and output amplifier according to the present invention. During three separate output cycles, the settling time of the operational amplifier is shown as ts0, ts1, and ts2 test cycles. During test cycle zero, 0.50 V was sampled and held between time zero and 0.05 microseconds, and was output at time 0.05 microseconds until 0.50 microseconds. During test cycle one, 2.0 V was sampled and held between time 0.50 and 0.55 microseconds, and was output at time 0.55 microseconds until 1.00 microseconds. During test cycle two, 1.0 V was sampled and held between time 1.00 and 1.05 microseconds, and was output at time 1.05 microseconds.

While the present invention has been disclosed with particular reference to its preferred embodiment, that embodiment is presented by way of example, not by way of limitation. For example, as discussed above, the present invention is fully applicable to color analog flat panel displays. Those of ordinary skill in the art would be enabled by this disclosure to add to or modify the embodiment of the present invention in various ways as needed and still be within the scope and spirit of the present invention as recited in the appended claims. Accordingly, various changes and modifications which are obvious to a person skilled in the art to which the invention pertains are deemed to lie within the spirit and scope of the invention as claimed.

What is claimed is:

1. A method of driving an analog column of a video display from an analog line input using an operational amplifier having an op amp output and positive and negative differential inputs, a hold capacitor having positive and negative terminals, and a differential capacitor having positive and negative terminals, the method comprising the steps of:

(a) disabling the operational amplifier by reducing its current consumption to zero;
  (b) disconnecting the op amp output from the hold capacitor positive terminal;
  (c) connecting the hold capacitor negative terminal and the differential capacitor negative terminal to a common mode reference voltage;
  (d) sampling an analog line input voltage onto the hold capacitor positive terminal;
  (e) disconnecting the hold capacitor negative terminal and the differential capacitor negative terminal from the common mode reference voltage;
  (f) connecting the op amp output to the hold capacitor positive terminal; and
  (g) enabling the operational amplifier, by turning on its current supply, to drive the analog column.

2. A method of driving an analog column of a video display from an analog line input using an operational amplifier having an op amp output and positive and negative differential inputs, first and second hold capacitors each having positive and negative terminals, and first and second differential capacitors each having positive and negative terminals, the method comprising the steps of:

(a) disconnecting the op amp output from the first hold capacitor positive terminal;
  (b) connecting the first hold capacitor negative terminal and the first differential capacitor negative terminal to a common mode reference voltage;

(c) sampling an analog line input voltage onto the first hold capacitor positive terminal;

(d) disconnecting the first hold capacitor negative terminal and the first differential capacitor negative terminal from the common mode reference voltage;

(e) disconnecting the op amp output from the second hold capacitor positive terminal;

(f) connecting the op amp output to the first hold capacitor positive terminal;

(g) enabling the operational amplifier, by turning on its current supply, to drive the analog column;

(h) connecting the second hold capacitor negative terminal and the second differential capacitor negative terminal to the common mode reference voltage;

(i) sampling the analog line input voltage onto the second hold capacitor positive terminal;

(j) disconnecting the second hold capacitor negative terminal and the second differential capacitor negative terminal from the common mode reference voltage;

(k) disconnecting the op amp output from the first hold capacitor positive terminal;

(l) connecting the op amp output to the second hold capacitor positive terminal; and (m) enabling the operational amplifier, by turning on its current supply, to drive the analog column.

3. A column sample and hold circuit for an analog panel display having a clock input, an amplifier enable input, an analog video input, and a column analog video output, comprising:

a hold capacitor having a hold capacitor positive terminal and a hold capacitor negative terminal;

a differential capacitor having a differential capacitor positive terminal and a differential capacitor negative terminal;

a transmission gate having a transmission gate input, a transmission gate enable input, and a transmission gate output;

a hold capacitor switch having a hold capacitor switch input, a hold capacitor switch enable input, and a hold capacitor switch output;

a differential capacitor switch having a differential capacitor switch input, a differential capacitor switch enable input, and a differential capacitor switch output;

an operational amplifier having a negative differential operational amplifier input, a positive differential operational amplifier input, an operational amplifier output, a positive operational amplifier supply input, a negative operational amplifier supply input, and an operational amplifier enable input; and an operational amplifier feedback switch having an operational amplifier feedback switch input, an operational amplifier feedback switch enable input, and an operational amplifier feedback switch output;

wherein the hold capacitor positive terminal is connected to the transmission gate output, wherein the hold capacitor negative terminal is connected to the hold capacitor switch output;

wherein the differential capacitor positive terminal is connected to a reference voltage, wherein the differential capacitor negative terminal is connected to the differential capacitor switch output;

wherein the transmission gate input is connected to the analog video input, wherein the transmission gate output is connected to the operational amplifier feedback switch input;

wherein the hold capacitor switch input is connected to a common mode reference voltage, wherein the hold capacitor switch enable input is connected to the clock input;

wherein the differential capacitor switch input is connected to the common mode reference voltage, wherein the differential capacitor switch enable input is connected to the clock input;

wherein the operational amplifier enable input is connected to the amplifier enable input, wherein the operational amplifier output is connected to the operational amplifier feedback switch output; and wherein the operational amplifier feedback switch enable input is connected to the amplifier enable input, wherein the operational amplifier feedback switch output is connected to the column analog video output.

4. A column sample and hold circuit as in claim 3,
wherein the negative differential operational amplifier input is connected to the hold capacitor negative terminal, and
wherein the positive differential operational amplifier input is connected to the differential capacitor negative terminal.

5. A column sample and hold circuit as in claim 3, further comprising:

a negative differential operational amplifier input switch having a negative differential operational amplifier input switch input, a negative differential operational amplifier input switch enable input, and a negative differential operational amplifier input switch output; and a positive differential operational amplifier input switch having a positive differential operational amplifier input switch input, a positive differential operational amplifier input switch enable input, and a positive differential operational amplifier input switch output;

wherein the negative differential operational amplifier input switch input is connected to the hold capacitor negative terminal, wherein the negative differential operational amplifier input switch enable input is connected to the amplifier enable input, wherein the negative differential operational amplifier input switch output is connected to the negative differential operational amplifier input; and wherein the positive differential operational amplifier input switch input is connected to the differential capacitor positive terminal, wherein the positive differential operational amplifier input switch enable input is connected to the amplifier enable input, wherein the positive differential operational amplifier input switch output is connected to the positive differential operational amplifier input.

6. A column sample and hold circuit as in claim 5, further comprising:

a delay circuit having a delay circuit input and a delay circuit output;

wherein the delay circuit input is connected to the clock input, wherein the delay circuit output is connected to the transmission gate enable input.

7. A column sample and hold circuit as in claim 6, wherein the delay circuit includes first and second inverters.

8. A column sample and hold circuit as in claim 5,
wherein the negative differential operational amplifier input switch is an n-channel MOS transistor; and
wherein the positive differential operational amplifier input switch is an n-channel MOS transistor.

11

9. A column sample and hold circuit as in claim 3, wherein the reference voltage is ground.

10. A column sample and hold circuit as in claim 9, wherein the common mode reference voltage is approximately halfway between the negative operational amplifier supply voltage and the positive operational amplifier supply voltage.

11. A column sample and hold circuit as in claim 10, wherein the common mode reference voltage is 2.5 Volts, the negative operational amplifier supply voltage is ground, and the positive operational amplifier supply voltage is 5 Volts.

12. A column sample and hold circuit as in claim 11, wherein the transmission gate is implemented as an n-channel MOS transistor in series with a p-channel MOS transistor.

13. A column sample and hold circuit as in claim 12, wherein the hold capacitor switch is an n-channel MOS transistor;
wherein the differential capacitor switch is an n-channel MOS transistor; and
wherein the operational amplifier feedback switch is an n-channel MOS transistor.

14. A column sample and hold circuit for an analog panel display having a first clock input, a first amplifier enable input, an analog video input, and a column analog video output, comprising:

a first hold capacitor having a first hold capacitor positive terminal and a first hold capacitor negative terminal;

a first differential capacitor having a first differential capacitor positive terminal and a first differential capacitor negative terminal;

a first transmission gate having a first transmission gate input, a first transmission gate enable input, and a first transmission gate output;

a first hold capacitor switch having a first hold capacitor switch input, a first hold capacitor switch enable input, and a first hold capacitor switch output;

a first differential capacitor switch having a first differential capacitor switch input, a first differential capacitor switch enable input, and a first differential capacitor switch output;

a first operational amplifier feedback switch having a first operational amplifier feedback switch input, a first operational amplifier feedback switch enable input, and a first operational amplifier feedback switch output;

a second hold capacitor having a second hold capacitor positive terminal and a second hold capacitor negative terminal;

a second differential capacitor having a second differential capacitor positive terminal and a second differential capacitor negative terminal;

a second transmission gate having a second transmission gate input, a second transmission gate enable input, and a second transmission gate output;

a second hold capacitor switch having a second hold capacitor switch input, a second hold capacitor switch enable input, and a second hold capacitor switch output;

a second differential capacitor switch having a second differential capacitor switch input, a second differential capacitor switch enable input, and a second differential capacitor switch output;

a second operational amplifier feedback switch having a second operational amplifier feedback switch input, a

12 second operational amplifier feedback switch enable input, and a second operational amplifier feedback switch output;

an operational amplifier having a negative differential operational amplifier input, a positive differential operational amplifier input, an operational amplifier output, a positive operational amplifier supply input, a negative operational amplifier supply input, and first and second operational amplifier enable inputs;

a first negative differential operational amplifier input switch having a first negative differential operational amplifier input switch input, a first negative differential operational amplifier input switch enable input, and a first negative differential operational amplifier input switch output;

a first positive differential operational amplifier input switch having a first positive differential operational amplifier input switch input, a first positive differential operational amplifier input switch enable input, and a first positive differential operational amplifier input switch output;

a second negative differential operational amplifier input switch having a second negative differential operational amplifier input switch input, a second negative differential operational amplifier input switch enable input, and a second negative differential operational amplifier input switch output; and a second positive differential operational amplifier input switch having a second positive differential operational amplifier input switch input, a second positive differential operational amplifier input switch enable input, and a second positive differential operational amplifier input switch output;

wherein the first hold capacitor positive terminal is connected to the first transmission gate output, wherein the first hold capacitor negative terminal is connected to the first hold capacitor switch output;

wherein the first differential capacitor positive terminal is connected to a reference voltage, wherein the first differential capacitor negative terminal is connected to the first differential capacitor switch output;

wherein the first transmission gate input is connected to the analog video input, wherein the first transmission gate output is connected to the first operational amplifier feedback switch input;

wherein the first hold capacitor switch input is connected to a common mode reference voltage, wherein the first hold capacitor switch enable input is connected to the first clock input;

wherein the first differential capacitor switch input is connected to the common mode reference voltage, wherein the first differential capacitor switch enable input is connected to the first clock input;

wherein the first operational amplifier feedback switch enable input is connected to the first amplifier enable input, wherein the first operational amplifier feedback switch output is connected to the column analog video output;

wherein the second hold capacitor positive terminal is connected to the second transmission gate output, wherein the second hold capacitor negative terminal is connected to the second hold capacitor switch output;

wherein the second differential capacitor positive terminal is connected to a reference voltage, wherein the second differential capacitor negative terminal is connected to the second differential capacitor switch output;

wherein the second transmission gate input is connected to the analog video input, wherein the second transmission gate output is connected to the second operational amplifier feedback switch input;

wherein the second hold capacitor switch input is connected to a common mode reference voltage, wherein the second hold capacitor switch enable input is connected to the second clock input;

wherein the second differential capacitor switch input is connected to the common mode reference voltage, wherein the second differential capacitor switch enable input is connected to the second clock input;

wherein the second operational amplifier feedback switch enable input is connected to the second amplifier enable input, wherein the second operational amplifier feedback switch output is connected to the column analog video output;

wherein the first and second operational amplifier enable inputs are connected to the first and second amplifier enable inputs, respectively, wherein the operational amplifier output is connected to the first and second operational amplifier feedback switch outputs, respectively;

wherein the first negative differential operational amplifier input switch input is connected to the first hold capacitor negative terminal, wherein the first negative differential operational amplifier input switch enable input is connected to the first amplifier enable input, wherein the first negative differential operational amplifier input switch output is connected to the negative differential operational amplifier input;

wherein the first positive differential operational amplifier input switch input is connected to the first differential capacitor positive terminal, wherein the first positive differential operational amplifier input switch enable input is connected to the first amplifier enable input, wherein the first positive differential operational amplifier input switch output is connected to the positive differential operational amplifier input;

wherein the second negative differential operational amplifier input switch input is connected to the second hold capacitor negative terminal, wherein the second negative differential operational amplifier input switch enable input is connected to the second amplifier enable input, wherein the second negative differential operational amplifier input switch output is connected to the negative differential operational amplifier input; and wherein the second positive differential operational amplifier input switch input is connected to the second differential capacitor positive terminal, wherein the second positive differential operational amplifier input switch enable input is connected to the second amplifier enable input, wherein the second positive differential operational amplifier input switch output is connected to the positive differential operational amplifier input.

15. A column sample and hold circuit as in claim 14, further comprising:

a first delay circuit having a first delay circuit input and a first delay circuit output; and a second delay circuit having a second delay circuit input and a second delay circuit output;

wherein the first delay circuit input is connected to the first clock input, wherein the first delay circuit output is connected to the first transmission gate enable input; and wherein the second delay circuit input is connected to the second clock input, wherein the second delay circuit output is connected to the second transmission gate enable input.

16. A column sample and hold circuit as in claim 15, wherein the first and second delay circuits each include first and second inverters.

17. A column sample and hold circuit as in claim 14, wherein the reference voltage is ground.

18. A column sample and hold circuit as in claim 17, wherein the common mode reference voltage is approximately halfway between the negative operational amplifier supply voltage and the positive operational amplifier supply voltage.

19. A column sample and hold circuit as in claim 18, wherein the common mode reference voltage is 2.5 Volts, the negative operational amplifier supply voltage is ground, and the positive operational amplifier supply voltage is 5 Volts.

20. A column sample and hold circuit as in claim 19, wherein the first and second transmission gates are implemented as n-channel MOS transistors in series with corresponding p-channel MOS transistors.

21. A column sample and hold circuit as in claim 20, wherein the first and second hold capacitor switches are nchannel MOS transistors;

wherein the first and second differential capacitor switches are n-channel MOS transistors; and wherein the first and second operational amplifier feedback switches are n-channel MOS transistors.

22. A column sample and hold circuit as in claim 14, wherein the first and second negative differential operational amplifier input switches are n-channel MOS transistors; and wherein the first and second positive differential operational amplifier input switches are n-channel MOS transistors.

23. A method of driving an analog column of a video display from an analog line input using an operational amplifier having an op amp output and positive and negative differential inputs, a hold capacitor having positive and negative terminals, and a differential capacitor having positive and negative terminals, the method comprising the steps of:

(a) disabling the operational amplifier by reducing its current consumption to zero;

(b) disconnecting the op amp output from the hold capacitor positive terminal;

(c) connecting the hold capacitor negative terminal and the differential capacitor negative terminal to a common mode reference voltage;

(d) sampling an analog line input voltage onto the hold capacitor positive terminal;

(e) disconnecting the hold capacitor negative terminal and the differential capacitor negative terminal from the common mode reference voltage;

(f) connecting the op amp output to the hold capacitor positive terminal;

(g) enabling the operational amplifier, by turning on its current supply, to drive the analog column;

(h) prior to step (c), disconnecting the positive op amp differential input from the differential capacitor negative terminal and the negative op amp differential input from the hold capacitor negative terminal; and (i) after step (e) but before step (g), connecting the positive op amp differential input to the differential capacitor negative terminal and the negative op amp differential input to the hold capacitor negative terminal.

24. A method of driving an analog column of a video display from an analog line input using an operational amplifier having an op amp output and positive and negative differential inputs, first and second hold capacitors each having positive and negative terminals, and first and second differential capacitors each having positive and negative terminals, the method comprising the steps of:

(a) disconnecting the op amp output from the first hold capacitor positive terminal;

(b) connecting the first hold capacitor negative terminal and the first differential capacitor negative terminal to a common mode reference voltage;

(c) sampling an analog line input voltage onto the first hold capacitor positive terminal;

(d) disconnecting the first hold capacitor negative terminal and the first differential capacitor negative terminal from the common mode reference voltage;

(e) disconnecting the op amp output from the second hold capacitor positive terminal;

(f) connecting the op amp output to the first hold capacitor positive terminal;

(g) enabling the operational amplifier, by turning on its current supply, to drive the analog column;

(h) connecting the second hold capacitor negative terminal and the second differential capacitor negative terminal to the common mode reference voltage;

(i) sampling the analog line input voltage onto the second hold capacitor positive terminal;

(j) disconnecting the second hold capacitor negative terminal and the second differential capacitor negative terminal from the common mode reference voltage;

(k) disconnecting the op amp output from the first hold capacitor positive terminal;

(l) connecting the op amp output to the second hold capacitor positive terminal;

(m) enabling the operational amplifier, by turning on its current supply, to drive the analog column; and (n) repeating steps (a) through (m).

25. A method of driving an analog column of a video display from an analog line input as in claim 24, further comprising the steps of:

prior to step (c), disconnecting the positive op amp differential input from the first differential capacitor negative terminal and the negative op amp differential input from the first hold capacitor negative terminal;

after step (c) but before step (g), connecting the positive op amp differential input to the first differential capacitor negative terminal and the negative op amp differential input to the first hold capacitor negative terminal;

after step (g) but before step (i), disconnecting the positive op amp differential input from the second differential capacitor negative terminal and the negative op amp differential input from the second hold capacitor negative terminal; and after step (i) but before step (m), connecting the positive op amp differential input to the second differential capacitor negative terminal and the negative op amp differential input to the first hold capacitor negative terminal.

26. A method of driving an analog column of a video display from an analog line input using an operational amplifier having an op amp output and positive and negative differential inputs, first and second hold capacitors each having positive and negative terminals, and first and second differential capacitors each having positive and negative terminals, the method comprising the steps of:

(a) disconnecting the op amp output from the first hold capacitor positive terminal;

(b) connecting the first hold capacitor negative terminal and the first differential capacitor negative terminal to a common mode reference voltage;

(c) sampling an analog line input voltage onto the first hold capacitor positive terminal;

(d) disconnecting the first hold capacitor negative terminal and the first differential capacitor negative terminal from the common mode reference voltage;

(e) disconnecting the op amp output from the second hold capacitor positive terminal;

(f) connecting the op amp output to the first hold capacitor positive terminal;

(g) enabling the operational amplifier, by turning on its current supply, to drive the analog column;

(h) connecting the second hold capacitor negative terminal and the second differential capacitor negative terminal to the common mode reference voltage;

(i) sampling the analog line input voltage onto the second hold capacitor positive terminal;

(j) disconnecting the second hold capacitor negative terminal and the second differential capacitor negative terminal from the common mode reference voltage;

(k) disconnecting the op amp output from the first hold capacitor positive terminal;

(l) connecting the op amp output to the second hold capacitor positive terminal;

(m) enabling the operational amplifier, by turning on its current supply, to drive the analog column;

(n) prior to step (g), disabling the operational amplifier by reducing the current supply to zero; and (o) after step (g) but before step (m), disabling the operational amplifier by reducing its supply current to zero.

* * * * *